United States Patent [19]
Okonogi

[11] Patent Number: 6,057,036
[45] Date of Patent: May 2, 2000

[54] SEMICONDUCTOR SUBSTRATE HAVING A SERIOUS EFFECT OF GETTERING HEAVY METAL AND METHOD OF MANUFACTURING THE SAME

[75] Inventor: Kensuke Okonogi, Tokyo, Japan

[73] Assignee: NEC Corporation, Tokyo, Japan

[21] Appl. No.: 08/160,352

[22] Filed: Nov. 29, 1993

[30] Foreign Application Priority Data

Nov. 27, 1992 [JP] Japan .................................. 4-318983

[51] Int. Cl.⁷ .................................................. B32B 17/06
[52] U.S. Cl. ........................ 428/426; 428/428; 428/432; 428/446; 428/620
[58] Field of Search ................... 428/620, 426, 428/428, 432, 446

[56] References Cited

U.S. PATENT DOCUMENTS

| | | | |
|---|---|---|---|
| 4,282,543 | 8/1981 | Ihara et al. | 428/428 |
| 4,447,497 | 5/1984 | Manasevit | 428/446 |
| 4,576,851 | 3/1986 | Iwamatsu | 428/156 |
| 4,731,293 | 3/1988 | Ekholm et al. | 428/426 |
| 4,795,679 | 1/1989 | Ramesh et al. | 428/428 |
| 5,063,113 | 11/1991 | Wada | 428/446 |
| 5,063,181 | 11/1991 | Takita et al. | 428/426 |
| 5,094,714 | 3/1992 | Nishimura et al. | 428/428 |
| 5,275,872 | 1/1994 | Chang | 428/428 |

FOREIGN PATENT DOCUMENTS

| | | |
|---|---|---|
| 2-37771 | 2/1990 | Japan . |
| 2-54532 | 2/1990 | Japan . |
| 2-260428 | 10/1990 | Japan . |

*Primary Examiner*—Deborah Jones
*Assistant Examiner*—Cathy F. Lam
*Attorney, Agent, or Firm*—Young & Thompson

[57] ABSTRACT

A silicon dioxide layer overlies a monocrystal silicon substrate and has a first upper surface. A first monocrystal silicon layer overlies the first upper surface and has phosphorus atoms diffused. A second monocrystal silicon layer overlies the first monocrystal silicon layer. The first monocrystal silicon layer may have phosphorus or silicon atoms each of which has a positive electric charge instead of the phosphorus atoms diffused. A lattice mismatching layer may overlie the first upper surface instead of the first monocrystal silicon layer. The lattice mismatching layer has parts in each of which misfit dislocation is caused. The first and the second monocrystal silicon layers may overlie the monocrystal silicon substrate and layer, respectively. In this event, a silicon glass layer is interposed between the first and the second monocrystal silicon layers. The second monocrystal silicon layer has phosphorus atoms diffused.

10 Claims, 7 Drawing Sheets

6,057,036

SEMICONDUCTOR SUBSTRATE HAVING A SERIOUS EFFECT OF GETTERING HEAVY METAL AND METHOD OF MANUFACTURING THE SAME

BACKGROUND OF THE INVENTION

1. FIELD OF THE INVENTION

This invention relates to a semiconductor substrate and a method of manufacturing the semiconductor substrate.

2. DESCRIPTION OF RELATED ART

In the manner which will be described more in detail, a conventional semiconductor substrate comprises a monocrystal silicon substrate, a first silicon dioxide layer overlying on the monocrystal silicon substrate, a second silicon dioxide layer overlying the first silicon dioxide layer, a gettering layer overlying the second silicon dioxide layer, and a monocrystal silicon layer overlying the gettering layer. The conventional semiconductor substrate has an effect of gettering heavy metal that is not serious. Also, the conventional semiconductor substrate is expensive.

In the manner which will be described more in detail, another conventional semiconductor substrate comprises a monocrystal silicon substrate, a silicon dioxide layer overlying the monocrystal silicon substrate, a polycrystal silicon layer overlying the silicon dioxide layer, and a monocrystal silicon layer overlying the polycrystal silicon layer. This conventional semiconductor substrate has an effect of gettering heavy metal that is not serious. Also, this other conventional semiconductor substrate is expensive.

In the manner which will be described more in detail, still another semiconductor substrate comprises a monocrystal silicon substrate, a first silicon dioxide layer overlying the monocrystal silicon layer, a second silicon dioxide layer overlying the first silicon dioxide layer, and a monocrystal silicon layer overlying the second silicon dioxide layer. This semiconductor substrate has weak bonding strength between the monocrystal silicon substrate and the monocrystal silicon layer.

SUMMARY OF THE INVENTION

It is therefore an object of the present invention to provide a semiconductor substrate which has an effect of gettering heavy metal that is serious.

It is another object of this invention to provide a semiconductor substrate which is inexpensive.

It is still another object of this invention to provide a semiconductor substrate which has great bonding strength between a monocrystal silicon substrate and a monocrystal silicon layer.

Other objects of this invention will become clear as the description proceeds.

According to an aspect of this invention, there is provided a semiconductor substrate which comprises a monocrystal silicon substrate having a principal surface; a silicon dioxide layer overlying the principal surface and having a first upper surface; a first monocrystal silicon layer overlying the first upper surface and having phosphorus atoms diffused in the first monocrystal silicon layer which has a second upper surface; and a second monocrystal silicon layer overlying the second upper surface.

According to another aspect of this invention, there is provided a semiconductor substrate which comprises a monocrystal silicon substrate having a principal surface; a silicon dioxide layer overlying the principal surface and having a first upper surface; a first monocrystal silicon layer overlying the first upper surface and having phosphorus atoms each of which has a positive electric charge and is injected in the first monocrystal silicon layer having a second upper surface; and a second monocrystal silicon layer overlying the second upper surface.

According to still another aspect of this invention, there is provided a semiconductor substrate which comprises a monocrystal silicon substrate having a principal surface; a silicon dioxide layer overlying the principal surface and having a first upper surface; a first monocrystal silicon layer overlying the first upper surface and having silicon atoms each of which has a positive electric charge and is injected in the first monocrystal silicon layer having a second upper surface; and a second monocrystal silicon layer overlying the second upper surface.

According to yet another aspect of this invention, there is provided a semiconductor substrate which comprises a monocrystal silicon substrate having a principal surface; a silicon dioxide layer overlying the principal surface and having a first upper surface; a lattice mismatching layer overlying the first upper surface and having a second surface and causing misfit dislocation to occur therein; and a monocrystal silicon layer overlying the second upper surface.

According to a different aspect of this invention, there is provided a semiconductor substrate comprising a monocrystal silicon substrate having a principal surface; a first monocrystal silicon layer overlying the principal surface and having phosphorus atoms diffused in the first monocrystal silicon layer which has a first upper surface; a silicon glass layer overlying the first upper surface and having phosphorus atoms in the silicon glass layer which has a second upper surface; a second monocrystal silicon layer overlying the second upper surface and having phosphorus atoms diffused in the second monocrystal silicon layer which has a third upper surface; and a third monocrystal silicon layer overlying the third upper surface.

According to another different aspect of this invention, there is provided a method which is for manufacturing a semiconductor substrate and which comprises the steps of: (A) preparing a monocrystal silicon substrate having a principal surface; (B) forming a silicon dioxide layer on the principal surface so that the silicon dioxide layer has an upper surface; (C) preparing a monocrystal silicon film having a first lower surface; (D) forming a second monocrystal silicon layer on the first lower surface so that the second monocrystal silicon layer has phosphorus atoms diffused in the second monocrystal silicon layer and a second lower surface; (E) bonding the silicon dioxide layer to the second monocrystal silicon layer with the upper surface placed adjacent to the second lower surface; and (F) grinding the monocrystal silicon film.

According to still another different aspect of this invention, there is provided a method which is for manufacturing a semiconductor substrate and which comprises the steps of: (A) preparing a monocrystal silicon substrate having a principal surface; (B) forming a silicon dioxide layer on the principal surface so that the silicon dioxide layer has an upper surface; (C) preparing a monocrystal silicon film having a first lower surface; (D) forming a second monocrystal silicon layer on the first lower surface so that the second monocrystal silicon layer has phosphorus atoms each of which has a positive electric charge and is injected in the second monocrystal silicon layer having a second lower surface; (E) bonding the silicon dioxide layer to the second monocrystal silicon layer with the upper surface placed adjacent to the second lower surface; and (F) grinding the monocrystal silicon film.

According to yet another different aspect of this invention, there is provided a method which is for manufacturing a semiconductor substrate and which comprises the steps of: (A) preparing a monocrystal silicon substrate having a principal surface; (B) forming a silicon dioxide layer on the principal surface so that the silicon dioxide layer has an upper surface; (C) preparing a monocrystal silicon film having a first lower surface; (D) forming a second monocrystal silicon layer on the first lower surface so that the second monocrystal silicon layer has silicon atoms each of which has a positive electric charge and is injected in the second monocrystal silicon layer having a second lower surface; (E) bonding the silicon dioxide layer to the second monocrystal silicon layer with the upper surface placed adjacent to the second lower surface; and (F) grinding the monocrystal silicon film.

According to a further different aspect of this invention, there is provided a method which is for manufacturing a semiconductor substrate and which comprises steps of: (A) preparing a monocrystal silicon substrate having a principal surface; (B) forming a silicon dioxide layer on the principal surface so that the silicon dioxide layer has an upper surface; (C) preparing a monocrystal silicon film having a first lower surface; (D) forming a lattice mismatching layer on the first lower surface so that the lattice mismatching layer has a second lower surface and causes misfit dislocation therein; and (E) bonding the silicon dioxide layer to the lattice mismatching layer with the upper surface placed adjacent to the second lower surface; and (F) grinding the monocrystal silicon film.

According to a yet further different aspect of this invention, there is provided a method which is for manufacturing a semiconductor substrate and which comprises the steps of: (A) preparing a monocrystal silicon substrate having a principal surface; (B) preparing a monocrystal silicon film having a first lower surface; (C) forming a silicon glass layer on the first lower surface so that the silicon glass layer has phosphorus atoms in the silicon glass layer which has a second lower surface; (D) bonding the silicon glass layer to the monocrystal silicon substrate with the principal surface placed adjacent to the second lower surface to diffuse the phosphorus atoms into the monocrystal silicon substrate and the silicon glass layer; and (F) grinding the monocrystal silicon film.

DESCRIPTION OF THE PREFERRED EMBODIMENTS

Figure 1:
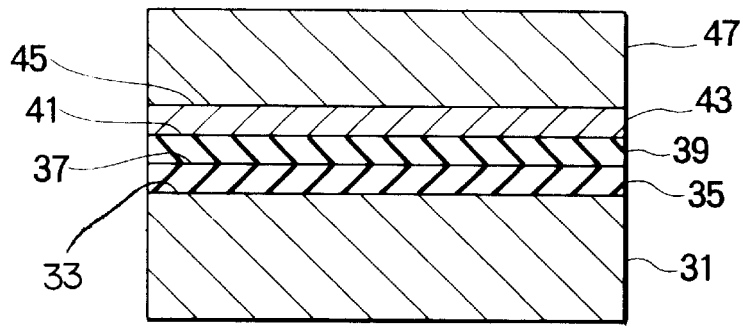
FIG. 1 is a schematic vertical sectional view of a conventional semiconductor substrate.

Referring to FIG. 1, a conventional semiconductor substrate will first be described for a better understanding of this invention.

This conventional semiconductor substrate is disclosed in Japanese Unexamined Patent Prepublication (Kôkai) No. 37771/1990. In FIG. 1, this conventional semiconductor substrate comprises a monocrystal silicon substrate 31 having a principal surface 33. A first silicon dioxide layer 35 overlies the principal surface 33 and has a first upper surface 37. A second silicon dioxide layer 39 overlies the first upper surface 37 and has a second upper surface 41. A gettering layer 43 overlies the second upper surface 41 and has a third upper surface 45. A first monocrystal silicon layer 47 overlies the third upper surface 45.

The gettering layer 43 comprises a silicon dioxide film and particles of oxygen deposited in the silicon dioxide film. As a result, this conventional semiconductor substrate has an effect of gettering heavy metal that is not serious. Also, this conventional semiconductor substrate is expensive.

Figure 2:
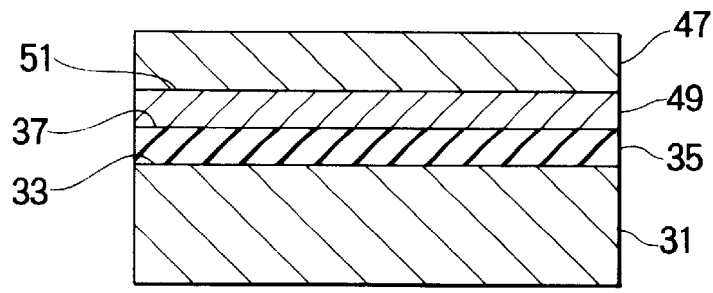
FIG. 2 is a schematic vertical sectional view of another conventional semiconductor substrate.

Referring to FIG. 2, another conventional semiconductor substrate will be described for a better understanding of this invention. Similar parts are designated by like reference numerals.

This conventional semiconductor substrate is disclosed in Japanese Unexamined Patent Prepublication (Kôkai) No. 260468/1990. This semiconductor substrate comprises the monocrystal silicon substrate 31 having the principal surface 33 and the first silicon dioxide layer 35 having the first upper surface 37. A polycrystal silicon layer 49 overlies the first upper surface 37 and has a fourth upper surface 51. The first monocrystal silicon layer 47 overlies the fourth upper surface 51. This conventional semiconductor substrate is supplied with heat which is caused by forming the polycrystal silicon layer 49. As a result, this conventional semiconductor substrate has an effect of gettering heavy metal that is not serious. Also, this conventional semiconductor substrate is expensive.

Figure 3:
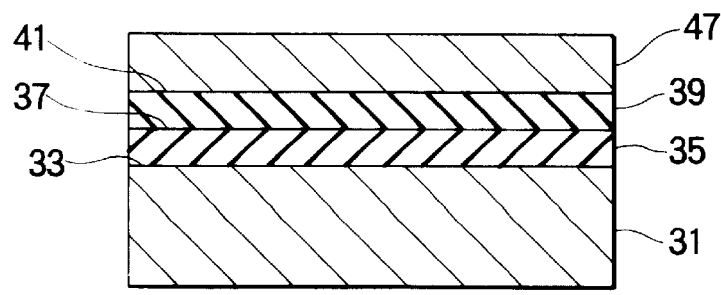
FIG. 3 is a schematic vertical sectional view of still another conventional semiconductor substrate.

Referring to FIG. 3, still another conventional semiconductor substrate will be described for a better understanding of this invention. Similar parts are designated by like reference numerals.

This conventional semiconductor substrate is disclosed in Japanese Unexamined Patent Prepublication (Kôkai) No. 54532/1990. This conventional semiconductor substrate comprises the monocrystal silicon substrate 31 having the principal surface 33, the first silicon dioxide layer 35 having the first upper surface 37, and the second silicon dioxide layer 49 having the second upper surface 51. The monocrystal silicon layer 47 overlies the second upper surface 51. The second silicon dioxide layer 39 is formed in an ambient atmosphere which comprises oxygen and hydrogen chloride. As a result, this conventional semiconductor substrate has weak bonding strength between the monocrystal silicon substrate 31 and the first monocrystal silicon layer 47.

Figure 4:
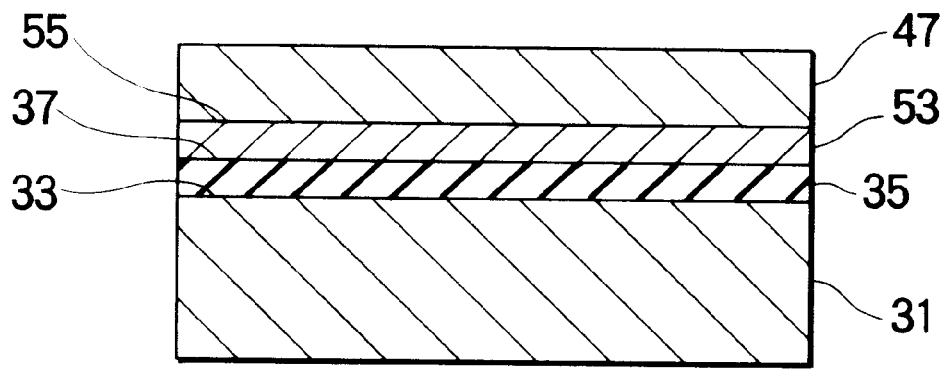
FIG. 4 is a schematic vertical sectional view of a semiconductor substrate according to a first embodiment of this invention.

Referring to FIG. 4, the description will proceed to a semiconductor substrate according to a first embodiment of this invention. Similar parts are designated by like reference numerals.

In FIG. 4, this semiconductor substrate comprises the monocrystal silicon substrate 31 having the principal surface 33 and the first silicon dioxide layer 35 overlying the principal surface 33 and having the first upper surface 37. A second monocrystal silicon layer 53 overlies the first upper surface 37 and has a fifth upper surface 55. The second monocrystal silicon layer 53 has phosphorus atoms diffused in the second monocrystal silicon layer 53. The first monocrystal silicon layer 47 overlies the fifth upper surface 55.

Figure 5:
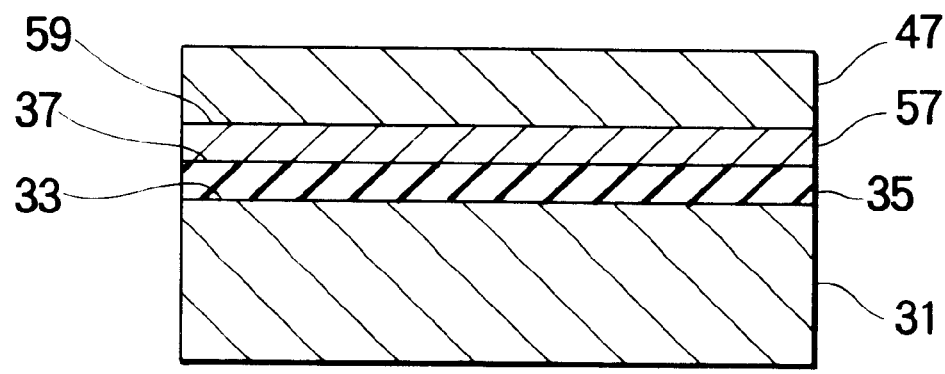
FIG. 5 is a schematic vertical sectional view of a semiconductor substrate according to a second embodiment of this invention.

Referring to FIG. 5, the description will proceed to a semiconductor substrate according to a second embodiment of this invention. Similar parts are designated by like reference numerals.

In FIG. 5, this semiconductor substrate comprises the monocrystal silicon substrate 31 having the principal surface 33 and the first silicon dioxide layer 35 overlying the principal surface 33 and having the first upper surface 37. A third monocrystal silicon layer 57 overlies the first upper surface 37 and has a sixth upper surface 59. The third monocrystal silicon layer 57 has phosphorus or silicon atoms each of which has a positive electric charge and is injected in the first monocrystal silicon layer 57. The first monocrystal silicon layer 47 overlies the sixth upper surface 59.

Figure 6:
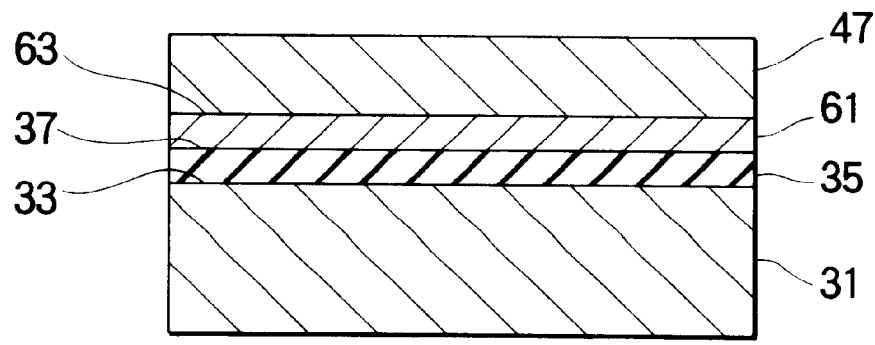
FIG. 6 is a schematic vertical sectional view of a semiconductor substrate according to a third embodiment of this invention.

Referring to FIG. 6, the description will proceed to a semiconductor substrate according to a third embodiment of this invention. Similar parts are designated by like reference numerals.

In FIG. 6, this semiconductor substrate comprises the monocrystal silicon substrate 31 having the principal surface 33 and the first silicon layer 35 overlying the principal surface 33 and having the first upper surface 37. A lattice mismatching layer 61 overlies the first upper surface 37 and has a seventh upper surface 63. The lattice mismatching layer 61 causes misfit dislocation therein. The first monocrystal silicon layer 47 overlies the seventh upper surface 63.

Figure 7:
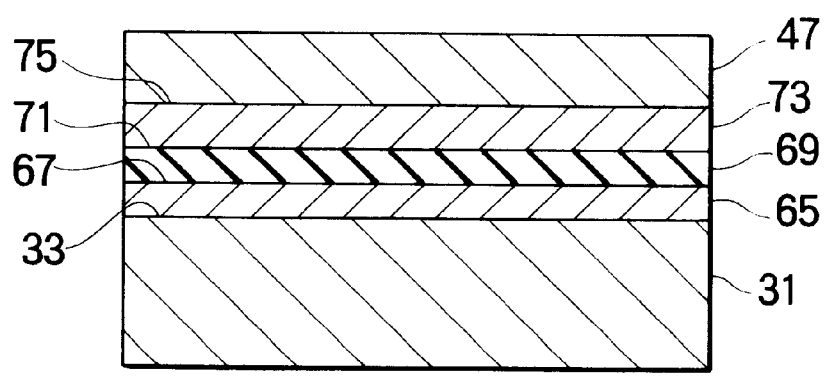
FIG. 7 is a schematic vertical sectional view of a semiconductor substrate according to a fourth embodiment of this invention.

Referring to FIG. 7, the description will proceed to a semiconductor substrate according to a fourth embodiment of this invention. Similar parts are designated by like reference numerals.

In FIG. 7, this semiconductor substrate comprises the monocrystal silicon layer 21 having the principal surface 33. A third monocrystal silicon layer 65 overlies the principal surface 33. The third monocrystal silicon layer 65 has phosphorus atoms diffused in the third monocrystal silicon layer 65. The third monocrystal silicon layer 65 has an eighth upper surface 67.

A silicon glass layer 69 overlies the eighth upper surface 67. The silicon glass layer 69 has phosphorus atoms in the silicon glass layer 69. The silicon glass layer 69 has a ninth upper surface 71. A fourth monocrystal silicon layer 73 overlies the ninth upper surface 71. The fourth monocrystal silicon layer 73 has phosphorus atoms diffused in the fourth monocrystal silicon layer 73. The fourth monocrystal silicon layer 73 has a tenth upper surface 75. The first monocrystal silicon layer 47 overlies the tenth upper surface 75.

In FIGS. 4 to 7, the monocrystal silicon substrate 31 has a thickness of 450 to 700 $\mu$m. The first silicon dioxide layer 35 has a thickness of 0.05 to 2 $\mu$m. The first monocrystal layer 47 has a thickness of 0.05 to 50 $\mu$m. The second monocrystal silicon layer 53 has a thickness of 0.05 to 5 $\mu$m. The third monocrystal silicon layer 57 has a thickness of 0.05 to 0.5 $\mu$m. The lattice mismatching layer 61 has a thickness of 0.05 to 5 $\mu$m. The third monocrystal silicon layer 65 has a thickness of 0.05 to 5 $\mu$m. The silicon glass layer 69 has a thickness 0.05 to 2 $\mu$m. The fourth monocrystal silicon layer 73 as a thickness of 0.05 to 5 $\mu$m.

Referring to FIGS. 8 to 12 together with FIG. 4, the description will proceed to a method of manufacturing the semiconductor substrate illustrated in FIG. 4.

Figure 8:
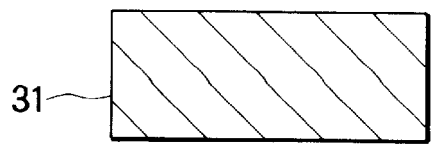
FIGS. 8 to 12 are schematic vertical sectional views of a semiconductor substrate at various steps of a method according to a fifth embodiment of this invention.
Figure 9:
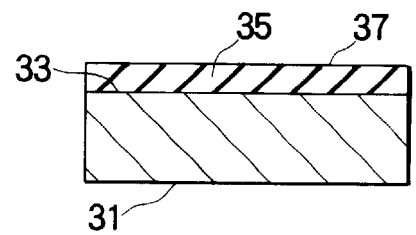

In FIG. 8, the monocrystal silicon substrate 31 was prepared in the known manner. In FIG. 9, the first silicon dioxide layer 35 was formed on the principal surface 33 by exposing, during one to three hours, the monocrystal silicon substrate 31 to an ambience which comprises $H_2$ and $O_2$ having a partial pressure of $H_2:O_2=1:1$ to 2:1 and which is held at a temperature of 1,000 to 1,200° C. The first silicon dioxide layer 35 was formed to have the first upper surface 37.

Figure 10:
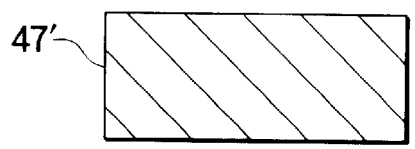

In FIG. 10, the monocrystal silicon film 47' was prepared in the known manner. For example, the monocrystal silicon film 47' is formed by the Czochralski method and has boron atoms in the monocrystal silicon film 47'. Also, the monocrystal silicon film 47' has a crystal azimuth of (100), an electrical resistivity of 10 to 50$\Omega$ cm, and an initial concentration of oxygen that is lower than $15 \times 10^{17}$. The monocrystal silicon film 47' has a thickness of 450 to 700 $\mu$m.

Figure 11:
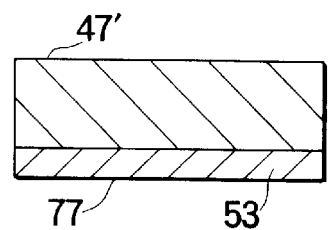

In FIG. 11, the second monocrystal silicon layer 53 was formed by injecting phosphorus atoms in the monocrystal silicon film 47' to include phosphorus atoms having a dose amount which is greater than $1 \times 10^{15}$ atoms/cm$^2$ and by exposing, during one to three hours, the monocrystal silicon film 47 to an ambient atmosphere which is held at a pressure around one atm. and at a temperature of 1,000 to 1,200° C. The second monocrystal layer 53 was formed to have a first lower surface 77.

Figure 12:
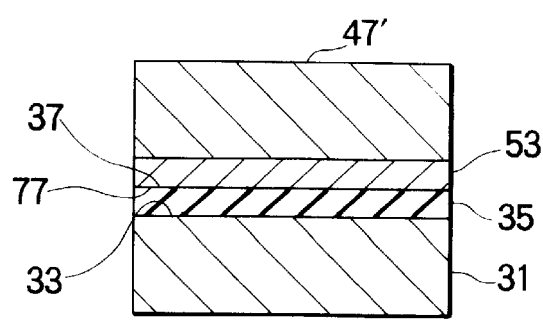

In FIG. 12, the second monocrystal layer 53 was bonded to the first silicon dioxide layer 35 with the first lower surface 77 placed adjacent to the first upper surface 37 by exposing, during one to three hours, the monocrystal silicon substrate 31, the first silicon dioxide layer 35, the second monocrystal layer 53, and the monocrystal silicon film 47' to an ambient atmosphere which is held at a pressure around one atm. and at a temperature of 1,000 to 1,200° C. In FIG. 4, the first monocrystal silicon layer 47 was formed by grinding the monocrystal silicon film 47'. As a result, the semiconductor substrate was formed.

In FIG. 11, a silicon glass film having phosphorus atoms may be formed instead of the second monocrystal silicon layer 53. The silicon glass film was formed by using a chemical vapor deposition method and by exposing, during one to three hours, the silicon glass film to an ambient atmosphere which is held at a pressure around one atm. and at a temperature of 1,000 to 1,200° C.

Referring to FIGS. 13 to 17 together with FIG. 5, the description will proceed to a method of manufacturing the semiconductor substrate illustrated in FIG. 5.

Figure 13:
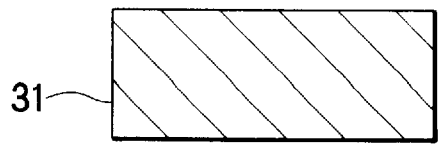
FIGS. 13 to 17 are schematic vertical sectional views of a semiconductor substrate at various steps of a method according to a sixth embodiment of this invention.
Figure 14:
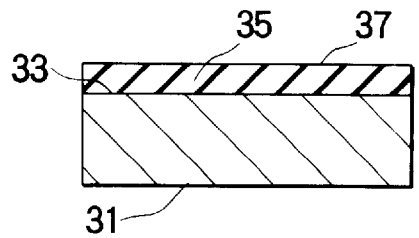
Figure 15:
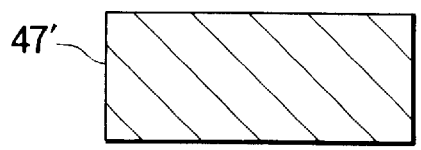

The steps of FIGS. 13 to 15 are similar to the steps of FIGS. 8 to 10.

Figure 16:
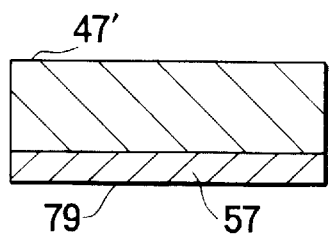

In FIG. 16, the third monocrystal silicon layer 57 was formed by injecting the phosphorus or silicon atoms in the monocrystal silicon film 47'. Each of the phosphorus or silicon atoms has a positive electric charge. The third monocrystal silicon layer 57 was formed to include phosphorus or silicon atoms having a dose amount which is greater than $1\times10^{15}$ atoms/cm$^2$. The third monocrystal silicon layer 57 was formed to have a second lower surface 79.

Figure 17:
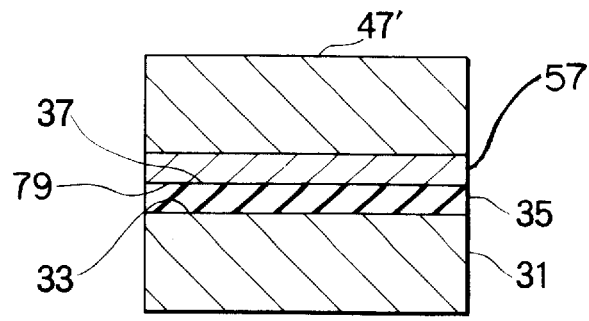

In FIG. 17, the third monocrystal silicon layer 57 was bonded to the first silicon dioxide layer 35 with the second lower surface 79 placed adjacent to the first upper surface 37 by exposing, during one to three hours, the monocrystal silicon substrate 31, the first silicon dioxide layer 35, the third monocrystal silicon layer 57, and the monocrystal silicon film 47' to an ambient atmosphere which is held at a pressure around one atm. and at a temperature of 1,000 to 1,200° C. In FIG. 5, the first monocrystal layer 47 was formed by grinding the monocrystal silicon film 47'. As a result, the semiconductor substrate was formed.

Referring to FIGS. 18 to 22 together with FIG. 6, the description will proceed to a method of manufacturing the semiconductor substrate illustrated in FIG. 6.

Figure 18:
FIGS. 18 to 22 are schematic vertical sectional views of a semiconductor substrate at various steps of a method according to a seventh embodiment of this invention.
Figure 19:
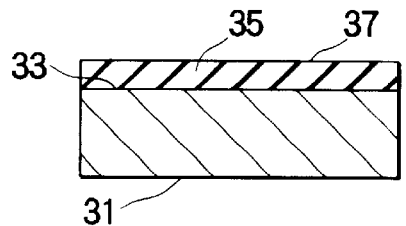
Figure 20:
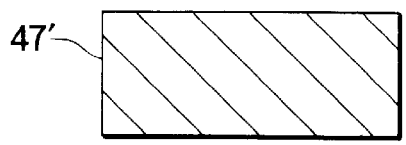

The steps of FIGS. 18 to 20 are similar to the steps of FIGS. 8 to 10.

Figure 21:
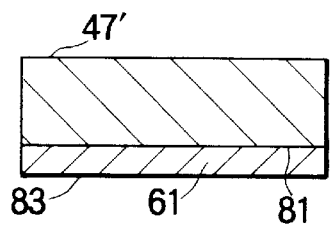

In FIG. 21, the lattice mismatching layer 61 was formed on a third lower surface 81 of the monocrystal silicon film 47' by using a chemical vapor deposition method so that the lattice mismatching layer 61 causes misfit dislocation therein. For example, this chemical vapor deposition method uses an ambience which comprises $SiH_2Cl_2$ and $GeH_4$ and which is held at a pressure of $10^{-3}$ to $10^{-4}$ Torr and at a temperature of 600 to 900° C. In this event, the lattice mismatching layer 61 is a layer which comprises SiGe. The lattice mismatching layer 61 was formed to have a fourth lower surface 83.

Figure 22:
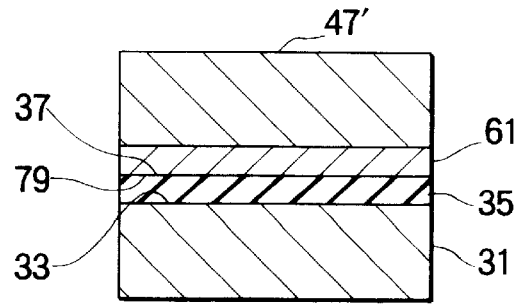

In FIG. 22, the lattice mismatching layer 61 was bonded to the first silicon dioxide layer 35 with the fourth lower surface 83 placed adjacent to the first upper surface by exposing, during one to three hours, the monocrystal silicon substrate 31, the first silicon dioxide layer 35, the lattice mismatching layer 61, and the monocrystal silicon film 47' to an ambient atmosphere which is held at a pressure around one atm. and at a temperature of 1,000 to 1,200° C. In FIG. 6, the first monocrystal silicon layer 47 was formed by grinding the monocrystal silicon film 47'. As a result, the semiconductor substrate was formed.

In FIG. 21, in case where the lattice mismatching layer 61 comprises GaAs, the lattice mismatching layer 61 is formed by using a molecular beam epitaxy method or a metal organic chemical vapor deposition method. In case where the lattice mismatching layer 61 comprises a material except GaAs, the lattice mismatching layer 61 may be formed by the chemical vapor deposition method.

In FIGS. 11, 16, and 21, a bonding silicon dioxide layer (not shown) may be formed on the first, the second, or the fourth lower surface 77, 79, or 83 in the manner illustrated in FIG. 9.

Referring to FIGS. 23 to 26 together with FIG. 7, the description will proceed to a method of manufacturing the semiconductor substrate illustrated in FIG. 7.

Figure 23:
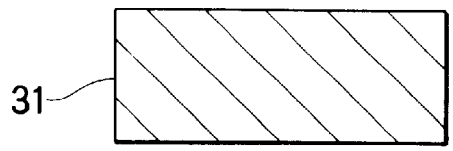
FIGS. 23 to 26 are schematic vertical sectional views of a semiconductor substrate at various steps of a method according to an eighth embodiment of this invention.
Figure 24:
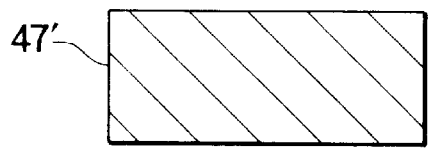

The steps of FIGS. 23 and 24 are similar to the steps of FIGS. 8 and 10.

Figure 25:
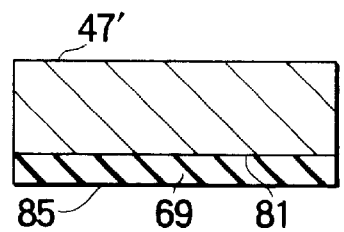

In FIG. 25, the silicon glass layer 69 was formed on the third lower surface 81 by using the chemical vapor deposition method so that the silicon glass layer 69 has phosphorus atoms in the silicon glass layer 69. For example, this chemical vapor deposition method uses an ambience which comprises $SiH_4$, $N_2$, $N_2$, and $PH_3$ and which is held at a pressure around 2 to 5 Torr during about 30 seconds to 2 minutes. In this event, the monocrystal silicon film 47' is held at a temperature around 400° C. The silicon glass layer 69 was formed to have a fifth lower surface 85.

Figure 26:
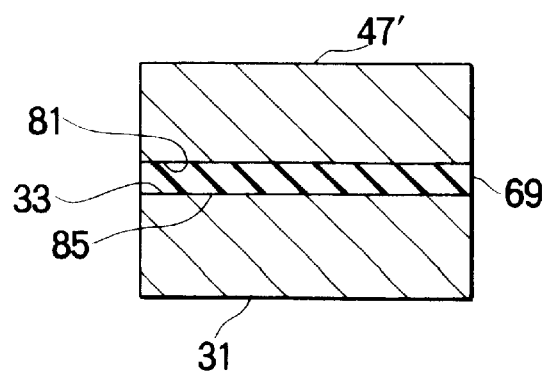

In FIG. 26, the silicon glass layer 69 was bonded to the monocrystal silicon substrate 31 with the fifth lower surface 85 placed adjacent to the principal surface 33 by exposing, during 20 to 180 minutes, the monocrystal silicon substrate 31, the silicon glass layer 69, and the monocrystal silicon film 47' to an ambience which comprises $O_2$ and $N_2$ and which is held at a pressure around one atm. and at a temperature of 600 to 1,200° C. As a result, the third and the fourth monocrystal silicon layers 65 and 73 (FIG. 7) was formed to have phosphorus atoms which are diffused in the third and the fourth monocrystal silicon layers 65 and 73 from the silicon glass layer 69.

In FIG. 7, the monocrystal silicon layer 47 was formed by grinding the monocrystal silicon film 47'. As a result, the semiconductor substrate was formed.

In FIG. 1, a diode (not shown) was formed by diffusing phosphorus atoms in the monocrystal silicon layer 47 having a surface area of 1 mm$^2$. When this diode is supplied with an inverse bias voltage of 5 V, a leak current of around $10^{-10}$ A/cm$^2$ flows in this diode.

In FIG. 4, a diode (not shown) was formed by diffusing phosphorus atoms in the monocrystal silicon layer 47 having a surface area of 1 mm$^2$. when this diode is supplied with an inverse bias voltage of 5 V, a leak current of around $10^{-11}$ to $10^{-12}$ A/cm$^2$ flows in this diode.

Although the invention has been described in detail above in connection with various preferred embodiments thereof, it will be appreciated by those skilled in the art that these embodiments have been provided solely for purposes of illustration, and are in no way to be considered as limiting the invention. Instead, various modifications and substitutions of equivalent techniques will be readily apparent to those skilled in the art upon reading this specification, and such modifications and substitutions are to be considered as falling within the true scope and spirit of the following claims.

What is claimed is:

1. A semiconductor substrate comprising:

a monocrystal silicon substrate having a principal surface;

a silicon dioxide layer overlying said principal surface and having a first upper surface;

a first monocrystal silicon layer overlying said first upper surface and having phosphorus atoms diffused in said first monocrystal silicon layer which has a second upper surface; and a second monocrystal silicon layer overlying said second upper surface.

2. A semiconductor substrate comprising:

a monocrystal silicon substrate having a principal surface;

a silicon dioxide layer overlying said principal surface and having a first upper surface;

a first monocrystal silicon layer overlying said first upper surface and having phosphorus atoms each of which has a positive electric charge and is injected in said first monocrystal silicon layer having a second upper surface; and a second monocrystal silicon layer overlying said second upper surface.

3. A semiconductor substrate comprising:

a monocrystal silicon substrate having a principal surface;

a silicon dioxide layer overlying said principal surface and having a first upper surface;

a first monocrystal silicon layer overlying said first upper surface and having silicon atoms each of which has a positive electric charge and is injected in said first monocrystal silicon layer having a second upper surface; and a second monocrystal silicon layer overlying said second upper surface.

4. A semiconductor substrate comprising:

a monocrystal silicon substrate having a principal surface;

a silicon dioxide layer overlying said principal surface and having a first upper surface;

a lattice mismatching layer overlying said first upper surface and having a second surface and causing misfit dislocation to occur therein; and a monocrystal silicon layer overlying said second upper surface.

5. A semiconductor substrate comprising:

a monocrystal silicon substrate having a principal surface;

a first monocrystal silicon layer overlying said principal surface and having phosphorus atoms diffused in said first monocrystal silicon layer which has a first upper surface;

a silicon glass layer overlying said first upper surface and having phosphorus atoms in said silicon glass layer which has a second upper surface;

a second monocrystal silicon layer overlying said second upper surface and having phosphorus atoms diffused in said second monocrystal silicon layer which has a third upper surface; and a third monocrystal silicon layer overlying said third upper surface.

6. The semiconductor substrate according to claim 1, wherein said monocrystal silicon substrate has a thickness of 450–700 $\mu$m, said silicon dioxide layer has a thickness of 0.05–2 $\mu$m, said first monocrystal silicon layer has a thickness of 0.05–5 $\mu$m, and said second monocrystal silicon layer has a thickness of 0.05–50 $\mu$m.

7. The semiconductor substrate according to claim 2, wherein said monocrystal silicon substrate has a thickness of 450–700 $\mu$m, said silicon dioxide layer has a thickness of 0.05–2 $\mu$m, said first monocrystal silicon layer has a thickness of 0.05–5 $\mu$m, and said second monocrystal silicon layer has a thickness of 0.05–50 $\mu$m.

8. The semiconductor substrate according to claim 3, wherein said monocrystal silicon substrate has a thickness of 450–700 $\mu$m, said silicon dioxide layer has a thickness of 0.05–2 $\mu$m, said first monocrystal silicon layer has a thickness of 0.05–5 $\mu$m, and said second monocrystal silicon layer has a thickness of 0.05–50 $\mu$m.

9. The semiconductor substrate according to claim 4, wherein said monocrystal silicon substrate has a thickness of 450–700 $\mu$m, said silicon dioxide layer has a thickness of 0.05–2 $\mu$m, said lattice mismatching layer has a thickness of 0.05–5 $\mu$m, and said monocrystal silicon layer has a thickness of 0.05–50 $\mu$m.

10. The semiconductor substrate according to claim 5, wherein said monocrystal silicon substrate has a thickness of 450–700 $\mu$m, said first monocrystal silicon layer has a thickness of 0.05–5 $\mu$m, said silicon glass layer has a thickness of 0.05–2 $\mu$m, said second monocrystal silicon layer has a thickness of 0.5–5 $\mu$m, and said third monocrystal silicon layer has a thickness of 0.05–50 $\mu$m.

* * * * *